US007242633B1

(12) United States Patent
Ching et al.

(10) Patent No.: US 7,242,633 B1
(45) Date of Patent: Jul. 10, 2007

(54) MEMORY DEVICE AND METHOD OF TRANSFERRING DATA IN MEMORY DEVICE

(75) Inventors: Alvin Y. Ching, Sunnyvale, CA (US);
Raymond C. Pang, San Jose, CA (US);
Steven P. Young, Boulder, CO (US);
Thanh Pham, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 141 days.

(21) Appl. No.: 11/044,740

(22) Filed: Jan. 26, 2005

Related U.S. Application Data (60) Provisional application No. 60/608,592, filed on Sep. 10, 2004.

(51) Int. Cl.
*G11C 8/00* (2006.01)
(52) U.S. Cl. .............................. 365/230.05; 365/189.04
(58) Field of Classification Search ........... 365/230.05, 365/189.04
See application file for complete search history.

(56) References Cited

U.S. PATENT DOCUMENTS 5,289,432 A * 2/1994 Dhong et al. .......... 365/230.05
6,346,825 B1 2/2002 Pang et al.
6,373,779 B1 4/2002 Pange et al.
6,986,004 B1 * 1/2006 Cheng et al. ............... 711/149

OTHER PUBLICATIONS

Jean-Louis Brelet et al.; "Using Virtex-II Block RAM for High Performance Read/Write CAMs"; XAPP260 (v1.1) Feb. 27, 2002; available from www.xillnx.com; pp. 1-12.

* cited by examiner

*Primary Examiner*—Huan Hoang
(74) *Attorney, Agent, or Firm*—John J. King; Keith A. Chanroo (57) ABSTRACT

According to one aspect of the invention, a circuit for accessing data in a memory is disclosed. The circuit generally comprises a first port having a read logic circuit and a first output which generates data from the memory. A second port has a read logic circuit and a write logic circuit. A second output is coupled to the second port, and also generates data from the memory. Circuits for separately selecting read and write widths for a port of a memory, such as a random access memory, are disclosed. Finally, other embodiments related to implementing a content addressable memory in a programmable logic device are disclosed. Further, a method of accessing data in a memory is disclosed.

21 Claims, 11 Drawing Sheets

| | rdcfg<2:0> | | | maskc<4:0> | | | | | port_width | | | | | |
|---|---|---|---|---|---|---|---|---|---|---|---|---|---|---|
| PW | <2> | <1> | <0> | <4> | <3> | <2> | <1> | <0> | <5> | <4> | <3> | <2> | <1> | <0> |
| 1 | 0 | 0 | 0 | 1 | 1 | 1 | 1 | 1 | 0 | 0 | 0 | 0 | 0 | 1 |
| 2 | 0 | 0 | 1 | 0 | 1 | 1 | 1 | 1 | 0 | 0 | 0 | 0 | 1 | 0 |
| 4 | 0 | 1 | 0 | 0 | 0 | 1 | 1 | 1 | 0 | 0 | 0 | 1 | 0 | 0 |
| 8 | 0 | 1 | 0 | 0 | 0 | 0 | 1 | 1 | 0 | 0 | 1 | 0 | 0 | 0 |
| 16 | 1 | 0 | 1 | 0 | 0 | 0 | 0 | 1 | 0 | 1 | 0 | 0 | 0 | 0 |
| 32 | 1 | 0 | 1 | 0 | 0 | 0 | 0 | 0 | 1 | 0 | 0 | 0 | 0 | 0 |

MEMORY DEVICE AND METHOD OF TRANSFERRING DATA IN MEMORY DEVICE

CROSS REFERENCE

This patent application claims priority to and incorporates by reference the U.S. Provisional Application Ser. No. 60/608,592, entitled "Memory Device and Method of Transferring Data in a Memory Device", by Alvin Y. Ching et al., filed Sep. 10, 2004.

FIELD OF THE INVENTION

The present invention relates generally to memory devices, and in particular, to a circuit for and method of transferring data in a memory device.

BACKGROUND OF THE INVENTION

Programmable logic devices typically include blocks of random access memory (BRAMs) distributed on the device. A BRAM could comprise a single access port or two (or more) separate and independent ports (i.e. a dual port BRAM). Dual port BRAMS are typically symmetrical, where both ports are interchangeable. Data can be written through either port, or can be read from the same port that received the data or the other port. Each port is typically synchronous and requires a clock. During a read operation, a read address is registered on the read port, and the stored data is loaded into the output latches after the RAM access interval passes.

During a write operation, the write address is registered on the write port, and the data which is input is stored in the addressed location of the memory. Three different modes are used to determine data which is available on the output latches after a write operation. In a write-first mode, also commonly called a transparent write mode, input data is simultaneously written into memory and stored in the data output. In a read first mode, also called a read before write mode, data previously stored at the write address appears on the output latches, while the input data is being stored in memory. Finally, in a no-change mode, the output latches remain unchanged during a write operation. An example of a Block RAM having multiple write modes can be found in U.S. Pat. No. 6,373,779 entitled, "Block RAM having multiple configurable write modes for use in a field programmable gate array" (Issued Apr. 16, 2002).

Figure 1:
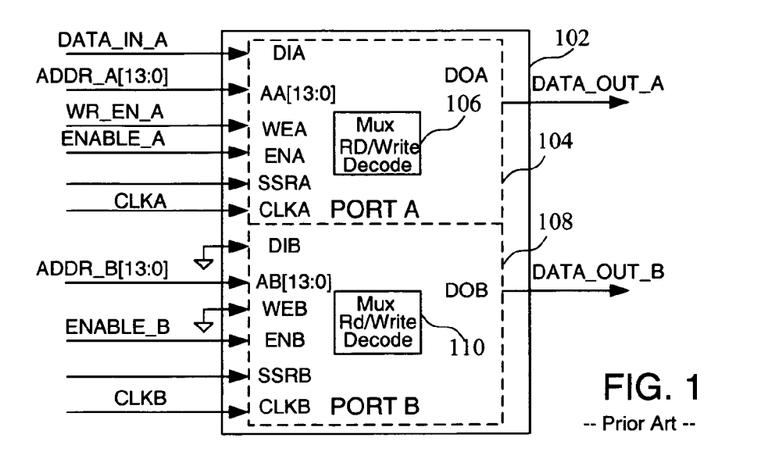
FIG. 1 is a block diagram of a conventional dual port BRAM.

However, the ability to read from and write to conventional BRAMS may be limited. As shown for example in the block diagram of a conventional dual port BRAM of FIG. 1, each port comprises a multiplexer read/write decode logic circuit. That is, the dual port BRAM 102 comprises a first port 104 having a single multiplexer read/write decode logic circuit 106, and a second port 108 also having a single multiplexer read/write decode logic circuit 110. The inputs of a conventional dual port BRAM are often configured to either write to or read from Port A and read from Port B. Because a common multiplexer decode circuit is used for both reading and writing for a given port, the read and write widths of the port are the same. That is, a single set of configuration inputs dictate the port width for both the read and write widths of a given port of the BRAM. Accordingly, the user must both read data having a certain width from a port and write data having the same width to that port.

Such a restriction limits the functionality of a BRAM. For example, if a port is used for writing, a certain width (e.g. 1 bit port width) for serially writing data to the port could be selected. However, when reading from the port, a different width (e.g. 32 bits) may be desired. Accordingly, the width for a port having a common multiplexer read/write decode logic circuit used for both reading and writing must be changed if a port is used for a different function having a different port width. That is, the width of the common multiplexer circuit must be selected depending upon whether the port is used for reading or writing. If Port A is set in a "x32" mode, both reading from and writing to the BRAM will occur in 32 bit widths through that port. In order to read or write with different widths, both Ports A and B of the BRAM must be used (i.e. one for reading in at one width and one for writing at a different width). Accordingly, there is a need for a random access memory enabling more efficient input and output of data.

While BRAMs on programmable logic devices are often used for conventional data storage, BRAMs can also be employed to provide a number of other functions. For example, a BRAM can be configured to function as a Content Addressable Memory (CAM), also referred to as an associative memory. CAMs are a class of parallel pattern matching circuits. In one mode, these circuits operate like standard memory circuits and may be used to store binary data. However, unlike standard memory circuits, a match mode of a CAM permits all of the data in the CAM device to be searched in parallel. As will be described in more detail below in reference to embodiments of the invention, a binary input word is compared with all of the words in the CAM. If any of the memory locations has the same binary bit pattern as the input word, an output signal is activated indicating that a match has occurred. In addition, the location that contains the same bit pattern is indicated. Accordingly, rather than outputting data as in a conventional memory, a CAM outputs the address of the memory location which stores a given input data word.

Because a content addressable memory is a digital circuit, it may be implemented in an FPGA or some other programmable logic device. However, conventional BRAMs implemented as CAMS have certain limitations. BRAMs implemented as CAMs generally include an array of registers to hold the data, and then use some collection of comparators to see if a match has occurred. However, using gate level logic such as programmable logic often results in a penalty. For example, because this CAM implementation in an FPGA relies on flip-flops as the data storage elements, the size of the circuit is restricted by the number of flip flops in the device.

Accordingly, there is also a need for a more efficient method of and circuit for implementing a CAM in a programmable logic device.

SUMMARY OF THE INVENTION

According to one aspect of the invention, a circuit for accessing data in a memory is disclosed. The circuit generally comprises a first port having a read logic circuit and a first output which generates data from the memory. A second port has a read logic circuit and a write logic circuit. A second output is coupled to the second port, and also generates data from the memory. Circuits for separately selecting read and write widths for a port of a memory, such as a BRAM, are disclosed. Finally, other embodiments related to implementing a content addressable memory in a programmable logic device are disclosed.

Further, a method of accessing data in a memory is disclosed. The method comprises the steps of providing a first port of a dual port random access memory having a read logic circuit and a write logic circuit. A read width for the read logic circuit and a write width for the write logic circuit of the first port can be selected. Embodiments for reading data from the first and second ports of the dual port memory, such as a dual port random access memory, are also disclosed. Finally, methods of implementing a content addressable memory in a programmable logic device are also disclosed.

DETAILED DESCRIPTION OF THE DRAWINGS

Figure 2:
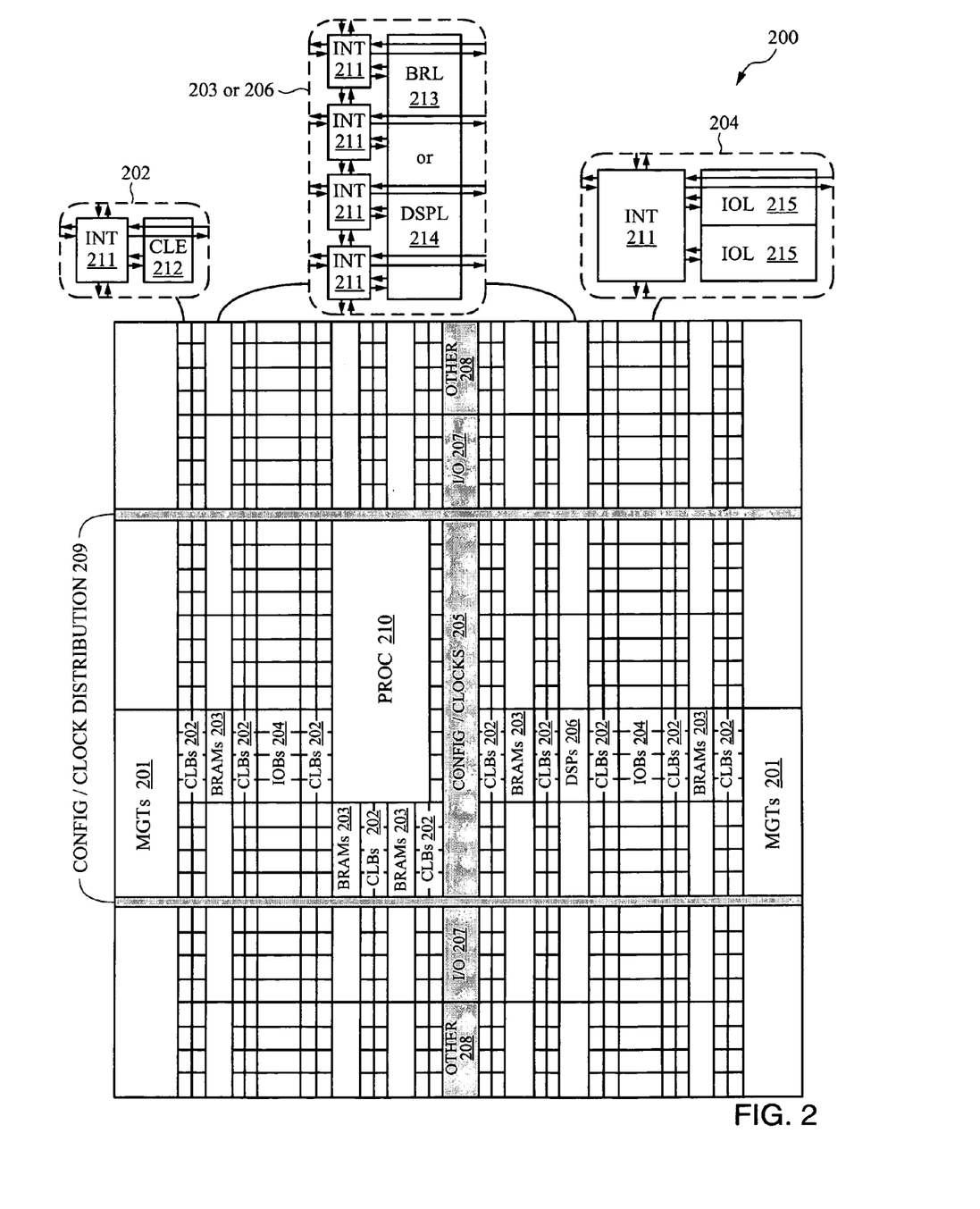
FIG. 2 is a block diagram of a circuit for implementing the memory devices and methods for enabling transferring data according to embodiments of the present invention.

Turning first to FIG. 2, a block diagram of a circuit for implementing circuits and methods for enabling transferring data according to an embodiment of the present invention is shown. In particular, advanced FPGAs can include several different types of programmable logic blocks in the array. For example, FIG. 2 illustrates an FPGA architecture 200 that includes a large number of different programmable tiles including multi-gigabit transceivers (MGTs 201), configurable logic blocks (CLBs 202), random access memory blocks (BRAMs 203), input/output blocks (IOBs 204), configuration and clocking logic (CONFIG/CLOCKS 205), digital signal processing blocks (DSPs 206), specialized input/output blocks (I/O 207) (e.g., configuration ports and clock ports), and other programmable logic 208 such as digital clock managers, analog-to-digital converters, system monitoring logic, and so forth. Some FPGAs also include dedicated processor blocks (PROC 210).

In some FPGAs, each programmable tile includes a programmable interconnect element (INT 211) having standardized connections to and from a corresponding interconnect element in each adjacent tile. Therefore, the programmable interconnect elements taken together implement the programmable interconnect structure for the illustrated FPGA. The programmable interconnect element (INT 211) also includes the connections to and from the programmable logic element within the same tile, as shown by the examples included at the top of FIG. 2.

For example, a CLB 202 can include a configurable logic element (CLE 212) that can be programmed to implement user logic plus a single programmable interconnect element (INT 211). A BRAM 203 can include a BRAM logic element (BRL 213) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 206 can include a DSP logic element (DSPL 214) in addition to an appropriate number of programmable interconnect elements. An IOB 204 can include, for example, two instances of an input/output logic element (IOL 215) in addition to one instance of the programmable interconnect element (INT 211). As will be clear to those of skill in the art, the actual I/O pads connected, for example, to the I/O logic element 215 are manufactured using metal layered above the various illustrated logic blocks, and typically are not confined to the area of the input/output logic element 215.

In the pictured embodiment, a columnar area near the center of the die (shown shaded in FIG. 2) is used for configuration, clock, and other control logic. Horizontal areas 209 extending from this column are used to distribute the clocks and configuration signals across the breadth of the FPGA. Some FPGAs utilizing the architecture illustrated in FIG. 2 include additional logic blocks that disrupt the regular columnar structure making up a large part of the FPGA. The additional logic blocks can be programmable blocks and/or dedicated logic. For example, the processor block PROC 210 shown in FIG. 2 spans several columns of CLBs and BRAMS.

Note that FIG. 2 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 2 are purely exemplary. For example, in an actual FPGA more than one adjacent column of CLBs is typically included wherever the CLBs appear, to facilitate the efficient implementation of user logic. Similarly the circuits and methods of the present invention could be implemented in any device, including any type of programmable logic device, having memory.

Figure 3:
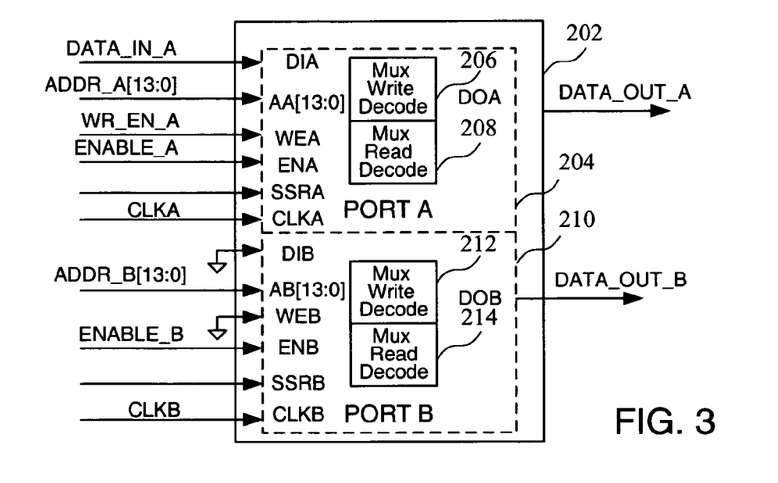
FIG. 3 is a block diagram of a dual port BRAM according to an embodiment of the present invention.

Turning now to FIG. 3, a block diagram of a dual port BRAM according to an embodiment of the present invention is shown. As can be seen, the inputs of the dual port BRAM are often configured to either write to or read from Port A, and read from Port B. According to one aspect of the present invention, independent read port and write port widths can be achieved, for example, by providing separate read logic circuits and write logic circuits that allows the read width and write width of a given port to be independent of each other. In particular, a dual port BRAM 202 comprises a first port 204 having read and write logic circuits comprising a multiplexer write decode circuit 206 and a separate multiplexer read decode circuit 208. Circuits for implementing the multiplexer read decode circuit 208 and the multiplexer write decode circuit 206 are described in more detail in reference to FIGS. 9 and 11, respectively. Similarly, dual port BRAM 202 comprises a second port 210 having a multiplexer write decode circuit 212 and a separate multiplexer read decode circuit 214. Accordingly, the circuit of FIG. 3 enables the read and write widths of a given port to be independent of each other. For example, Port A could be configured to read 32 bit words when reading from Port A, and write 1 bit words when writing to Port A. Similarly, Port B could be configured to read and write words having different widths, as well as read and write widths which are independent of the read and write widths of Port A.

Figure 4:
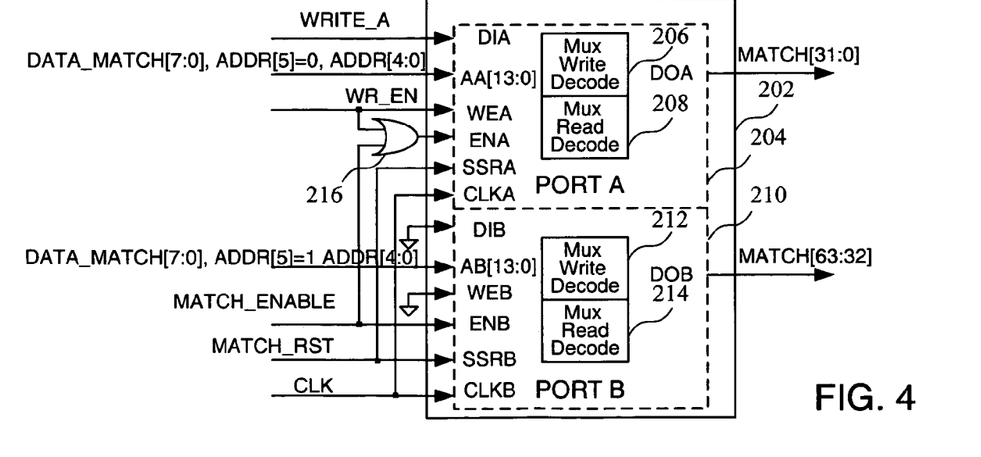
FIG. 4 is a block diagram of a dual port BRAM operating as a CAM and showing a read function according to an embodiment of the present invention.

Turning now to FIG. 4, a block diagram of a dual port BRAM operating as a CAM and implementing a read function according to an embodiment of the present invention is shown. According to the implementation of the dual port BRAM of FIG. 4, data may be read from both ports. That is, the port widths of multiplexer read decode circuit 208 of Port A and the multiplexer read decode circuit 214 of Port B can be selected for reading words having a predetermined width. For example, the port width of each port can be selected to output a 32 bit word when reading. As will be described in more detail below, such a configuration enables the dual port BRAM to generate a 64 bit output word.

As shown in the embodiment of FIG. 4, an OR gate 216 is preferably used to enable Port A when the write enable (WR_EN) is valid or MATCH_ENABLE to Port B is valid. When reading, a MATCH_ENABLE signal is provided to the enable input of Port A (ENA) and the enable input of Port B (ENB). The DATA_MATCH [7:0], which is the data to be matched by the CAM, and ADDR[4:0] are also coupled to the address inputs of both Port A and Port B. However, by setting bit 5 of the address for Port A to 0 and bit 5 of the address for Port B to 1, only two CAMs are required to output a 128 bit word, as will be described in more detail in reference to FIG. 15. A WRITE_A signal is coupled to the Data Input A (DIA) input. Also, a match reset (MATCH_RST) signal is coupled to the SSRA and SSRB inputs. Finally, the ports are preferably coupled to a common clock. As can be seen, 32 bits of the match (MATCH[31:0]) are output from Port A, and the remaining 32 bits of the match (MATCH[63:32]) are output from Port B. A circuit for implementing a BRAM using parity bits as described in more detail in U.S. Pat. No. 6,346,825 issued to Pang et al. could be used. The entire disclosure of U.S. Pat. No. 6,346,825 is incorporated by reference in this application. According to alternate embodiments of the invention, 36 bits could be output per port, as described for example in U.S. Pat. No. 6,346,825. Such an implementation provides an advantage where a user would like to write 9 bit words to a port, and read out 36 bit words from the port. However, it should be understood that any other combination of reading and writing with different read and write widths could be employed according to embodiments of the present invention.

Figure 5:
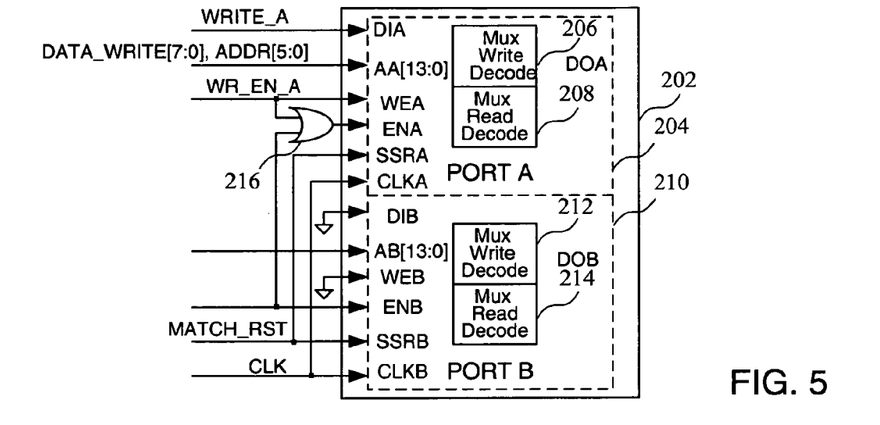
FIG. 5 is a block diagram of a dual port BRAM operating as a CAM and showing a write function according to an alternate embodiment of the present invention.

As can be seen in the embodiment of FIG. 5, Port A is used for writing, where a DATA_WRITE[7:0], ADDR[5:0] is input to the address port A. That is, when the dual port BRAM is used as a CAM as shown in FIG. 5, Port A could be configured to write WRITE_A to Port A of the BRAM, while the write enable of Port B (WEB) is disabled. Although the write enable of Port B is disabled when writing to Port A, as is commonly done when writing to a dual port BRAM used as a CAM, it is also possible to write to Port B when writing to Port A.

Figure 6:
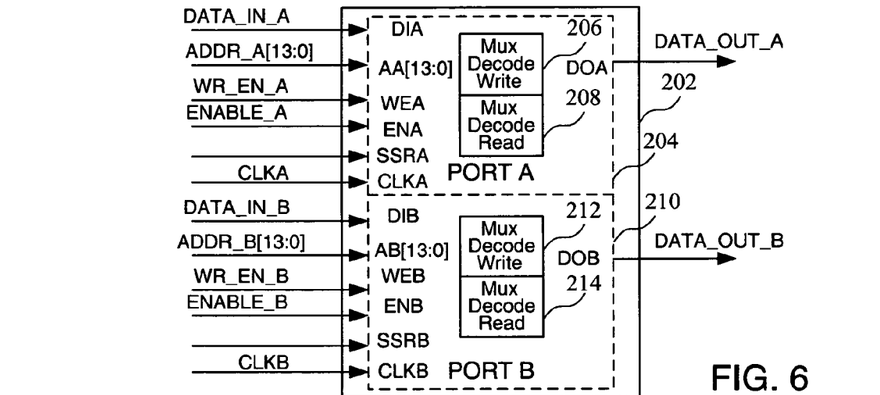
FIG. 6 is a block diagram of a dual port BRAM showing writing data to and reading data from both ports according to an embodiment of the present invention.

Turning now to FIG. 6, a block diagram shows writing data to and reading data from both ports of a dual port random access memory according to an embodiment of the present invention. For example, the BRAM of FIG. 6 could be configured to write data into the memory having a certain width, and serially read the data out. That is, because the read port width and the write port width are independent, data loaded into a given port of the BRAM can be read out of the same port having a different width.

Figure 7:
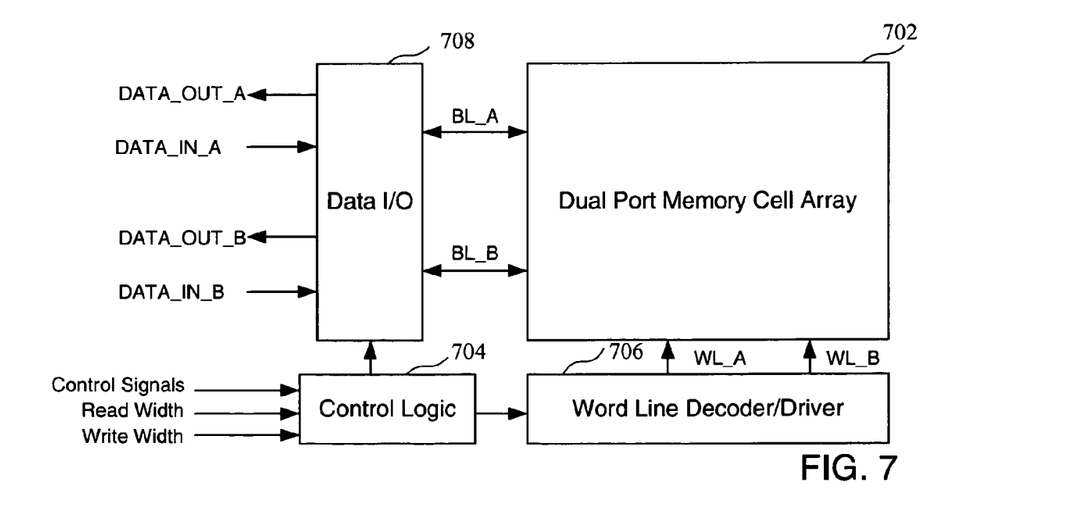
FIG. 7 is a block diagram of a BRAM showing the transfer of control and data signals according to an embodiment of the present invention.

Turning now to FIG. 7, a block diagram of a BRAM according to an embodiment of the present invention is shown. The Block RAM includes a dual-port memory cell array 702, control logic 704, word line decoder/driver circuit 706, and data input/output (I/O) circuit 708. Control logic 704 is coupled to receive the input signals for the first and second ports. According to one aspect of the embodiment of FIG. 7, separate read width and write width signals are provided with other control signals to the control logic. The function of the read and write width signals will be described in more detail to later figures. First port word lines WL_A and second port word lines WL_B run vertically through memory cell array 702. The word lines WL_A and WL_B are controlled by word line decoder/driver 706. First port bit line pairs BL_A and second port bit line pairs BL_B run horizontally through memory cell array 702. Bit line pairs BL_A and BL_B are coupled to data I/O circuit 708 as illustrated. The data I/O circuit 708 routes the input data values DATA_IN_A and DATA_IN_B to memory cell array 702, and routes the output data values DATA_OUT_A and DATA_OUT_B from memory cell array 702 under the control of control logic 302 as set forth in reference to FIG. 8. The circuit for implementing a BRAM using parity bits is described in more detail in U.S. Pat. No. 6,346,825 issued to Pang et al.

Figure 8:
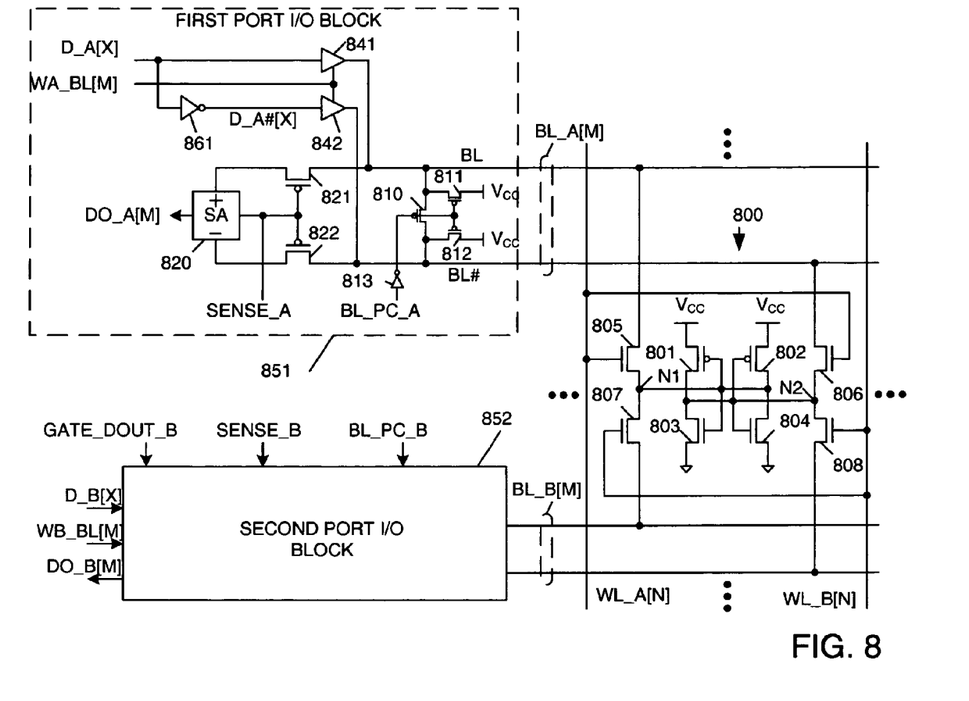
FIG. 8 is a circuit diagram of a memory element coupled to the data I/O blocks according to an embodiment of the present invention.

Turning now to FIG. 8, a circuit diagram of a dual-port random access memory cell 800 in memory cell array 702 and associated I/O blocks 851-852 in data I/O circuit 708 is shown. Each of the bit line pairs in memory cell array 702 is coupled to an associated I/O block in data I/O circuit 708. I/O block 851 is coupled to the bit lines of the first port of memory cell 800, and I/O block 852 is coupled to the bit lines of the second port of memory cell 800. As illustrated in FIG. 8, I/O blocks 851 and 852 operate in response to similar signals. Because I/O blocks 851 and 852 include identical circuitry, only I/O block 851 is described in detail. Dual-port RAM cell 800 includes p-channel pull-up transistors 801-802, n-channel pull-down transistors 803-804 and n-channel access transistors 805-808. Transistors 801-804 are configured to form a cross-coupled latch, which stores a logic high or logic low data value.

At the first port of memory cell 800, the drains of access transistors 805 and 806 are coupled to storage nodes N1 and N2, respectively. The gates of access transistors 805-806 are coupled to word line WL_A[N], where N is an integer between 0 and 127, inclusive. The sources of access transistors 805-806 are coupled to complementary bit line pair BL_A[M], where M is an integer between 0 and 143, inclusive. At the second port of memory cell 800, the drains of access transistors 807 and 808 are coupled to storage nodes N1 and N2, respectively. The gates of access transistors 807-808 are coupled to word line WL_B[N]. The sources of access transistors 807-808 are coupled to complementary bit line pair BL_B[M].

First port I/O block 851 includes p-channel bit line equalization transistor 810, p-channel pre-charge transistors 811-812, inverter 813, p-channel bit line select transistors 821-822, sense amplifier 820, data latch 830, tri-state write buffers 841-842 and inverter 861. Bit line equalization transistor 810 is connected across bit lines BL and BL# of the complementary bit line pair BL_A[M]. Pre-charge transistors 811 and 812 are connected between bit lines BL and BL#, respectively, and the $V_{CC}$ voltage supply terminal. The gates of transistors 810-812 are coupled to receive the inverse of a bit line pre-charge signal (BL_PC_A) from inverter 813. The bit line pre-charge signal BL_PC_A is provided by control logic 704. Bit line select transistors 821 and 822 are connected in series with bit lines BL and BL#, respectively, of the complementary bit line pair BL_A[M]. The gates of bit line select transistors 821 and 822 are coupled to receive a sense amplifier enable signal (SENSE_A) provided by control logic 704.

Sense amplifier 820 is also coupled to receive the sense amplifier enable signal SENSE_A from control logic 704. When the SENSE_A signal is asserted high, sense amplifier 820 is enabled. Differential input terminals of sense amplifier 820 are coupled to bit lines BL and BL# of bit line pair BL_A[M] through select transistors 821-822. As described in more detail below, sense amplifier 820 provides an output signal (DO_A[M]) on its output terminal. Sense amplifier 820 is coupled across bit lines BL and BL# of bit line pair BL_A[M]. Tri-state write data buffers 841-842 are coupled to receive the data input signal D_A[X] and the complement of the data input signal D_A#[X], where X is an integer between 0 and 31, inclusive. Inverter 861 provides the complementary data input signal D_A#[X] in response to the data input signal D_A[X]. Tri-state write data buffers 841-842 are enabled and disabled in response to a write control signal WA_BL[M] that is provided by control circuit 704.

Figure 9:
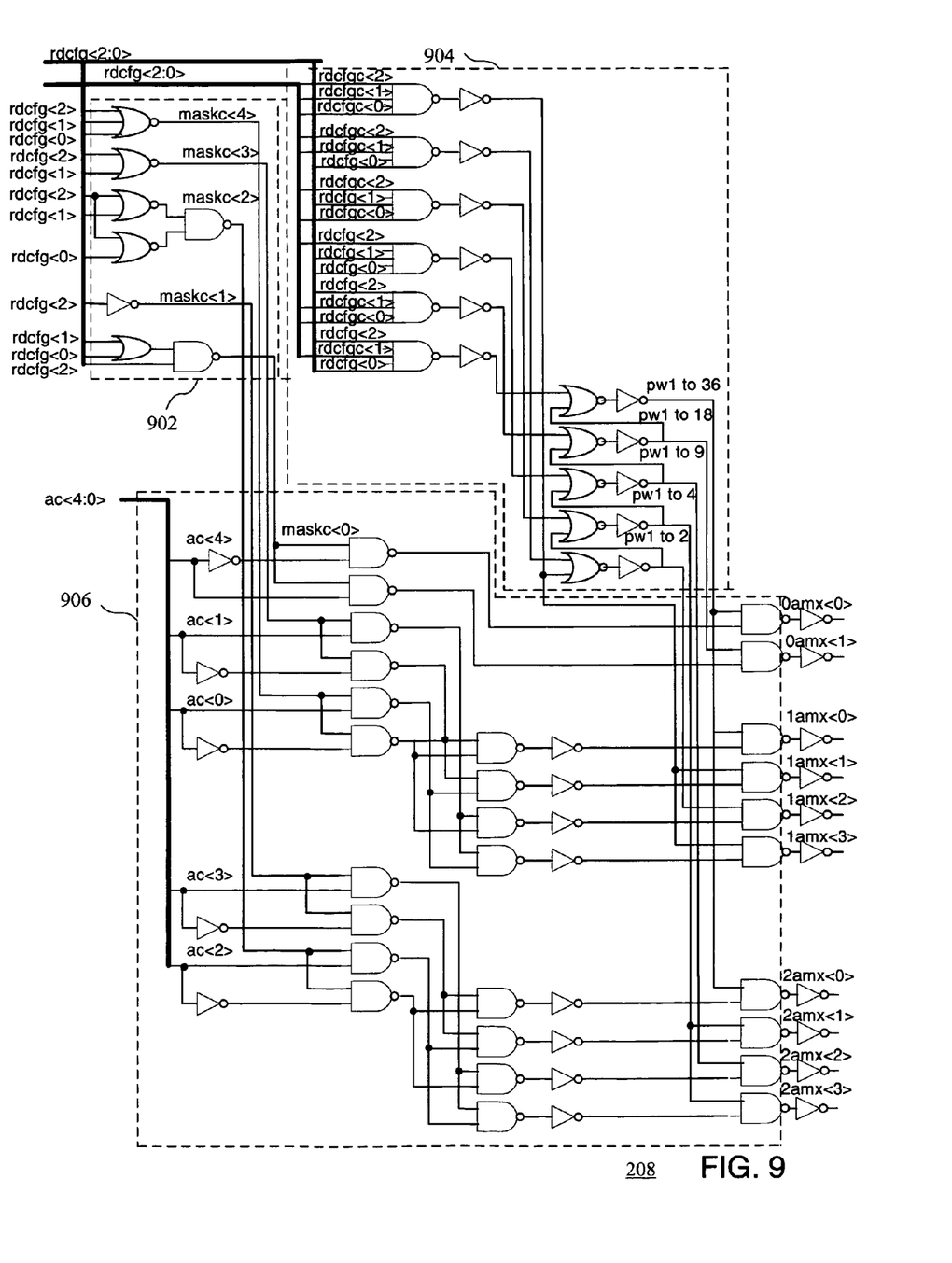
FIG. 9 is a read logic circuit enabling transferring data from a memory according to an embodiment of the present invention.
Figure 10:
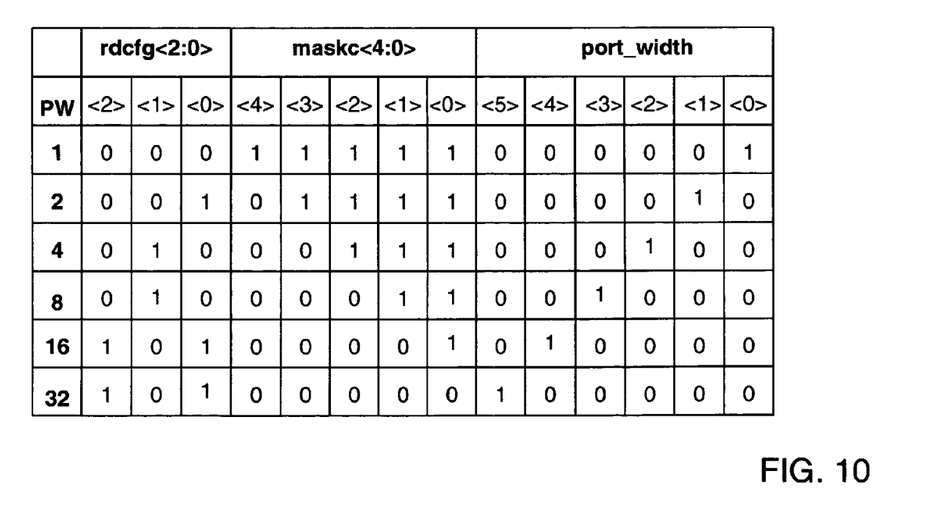
FIG. 10 is a table showing inputs for the configuration of the read logic circuit of FIG. 9 according to an embodiment of the present invention.

Turning now to FIG. 9, a multiplexer read decode circuit enabling transferring data from a memory according to an embodiment of the present invention is shown. The multiplexer read decode circuit comprises a control bit circuit 902 which is coupled to receive configuration inputs specific to the multiplexer read decode circuit. That is, rather than sharing configuration inputs between the read and write decode logic, independent read and write configuration inputs are introduced. Accordingly, configuration inputs for the read decode logic, rdcfg<2:0>, are coupled to the read decode logic circuit, while separate and independent configuration inputs wrcfg<2:0> are coupled to the write decode logic circuit, as will be described in more detail in reference to FIG. 11. The configuration inputs are also coupled to a port width circuit 904 to generate port width signals. Using the control bit circuit 902 and the configuration inputs, the port width will be generated by the port width control circuit 904 as set forth in the table of FIG. 10. Finally, an address selector 906 receives the address input bits ac<4:0> as well as the maskc<4:0> bits and the port width circuit outputs (pw1-to-2 through pw1-to-36) to generate the address selection bits 0amx<1:0>, 1amx<3:0>, and 2amx<3:0>. The address selection bits are coupled to the BRAM to enable reading data from the appropriate address to output the appropriate word.

Figure 11:
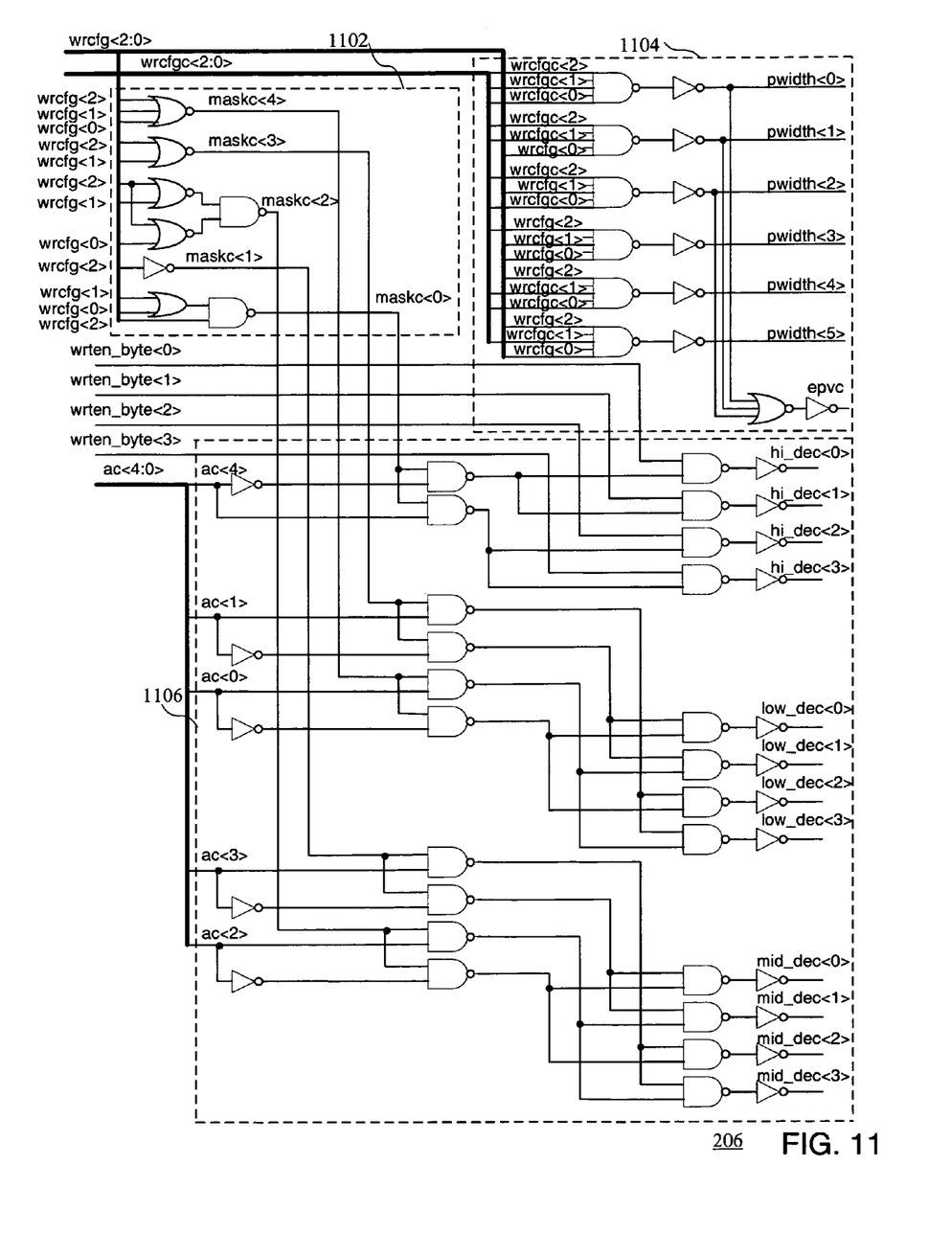
FIG. 11 is a write logic circuit enabling transferring data to a memory according to an embodiment of the present invention.

Turning now to FIG. 11, a multiplexer write decode circuit enabling transferring data to a memory according to an embodiment of the present invention is shown. The multiplexer write decode circuit comprises a control bit circuit 1102 which is coupled to receive configuration inputs which are specific to the multiplexer write decode circuit. Accordingly, configuration inputs for the multiplexer write decode circuit, wrcfg<2:0>, are coupled to the write decode logic circuit. The configuration inputs are also coupled to a port width circuit 1104 to generate port width signals for the write logic decode circuit. Using the control bit circuit 1102 and the configuration inputs, the port width will be generated by the port width control circuit 1104 as set forth in the FIG. 10, where the configuration inputs wrcfg<2:0> are the same as the rdcfg<2:0> of FIG. 10. A word line generator 1106 receives the address input bits ac<4:0> as well as the maskc<4:0> bits and port_width <5:0> bits to generate output bits hi_dec<3:0>, low_dec<3:0>, and mid_dec<3:0>. The output bits are coupled to the data I/O circuit to provide the appropriate write address.

In one embodiment of the present invention, FIGS. 9 and 11 above are examples of a configurable read decode logic circuit and a separate configurable write decode logic circuit, respectively, for a BRAM in a PLD such as the FPGA shown in FIG. 2. rdcfg<2:0> and wrcfg<2:0> are set by the configuration memory cells in a PLD during configuration or partial or full reconfiguration of the PLD. The configurable read decode logic circuit determines the read bus width to the BRAM depending on the read configuration bits, e.g., rdcfg, and the configurable write decode logic circuit determines the write bus width from the BRAM depending on the write configuration bits, e.g., wrcfg. Both the determination of the read bus width and the determination of the write bus width are done independently of each other. Hence this embodiment provides an integrated circuit including: a plurality of configuration memory cells; a configurable logic element programmed by at least one of the plurality of configuration memory cells; and a memory circuit having: a configurable read decode logic circuit coupled to at least one of the plurality of configuration memory cells for determining the read bus width to the memory circuit; and a configurable write decode logic circuit coupled to at least one of the plurality of configuration memory cells for independently determining the write bus width to the memory circuit.

Figure 12:
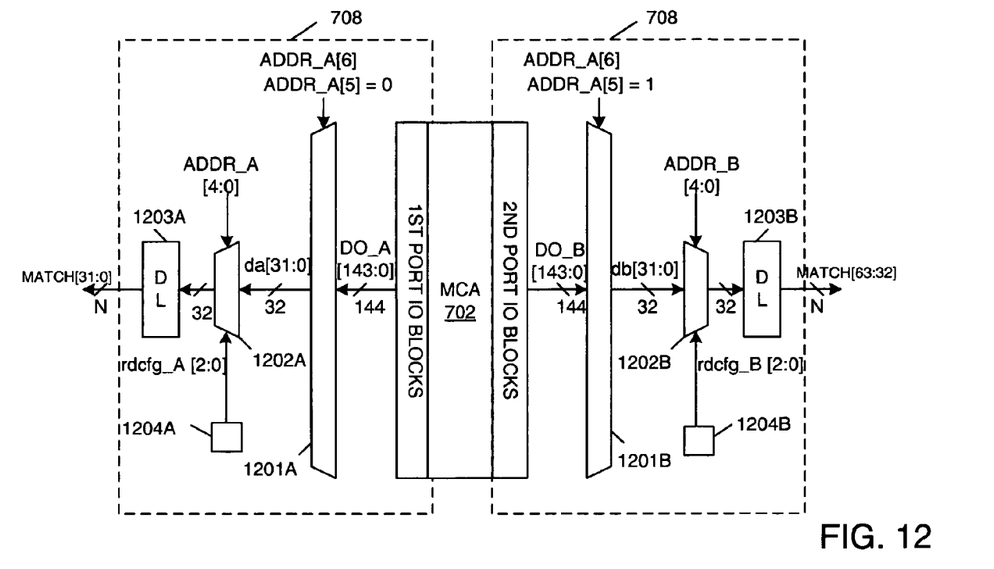
FIG. 12 is a block diagram showing read paths of first and second ports of a BRAM implemented as a CAM according to an embodiment of the present invention.

Turning now to FIG. 12, a block diagram shows read paths of first and second ports of a BRAM according to an embodiment of the present invention. In particular, the read path of the first port includes multiplexer 1201A, multiplexer 1202A and data latches 1203A. The read path of the second port includes multiplexer 1201B, multiplexer 1202B and data latches 1203B. Because these read paths are identical, only the read path of the first port is described in detail. The output data signals DO_A[143:0] provided by the sense amplifiers of the BRAM are provided to the input terminals of multiplexer 1201A. Multiplexer 1201A is configured to route the signals on one set of 32 bit lines in response to the address signals ADDR_A[6:5]. The 32-bits routed by multiplexer 1201A are provided to input terminals of multiplexer 1202A. Multiplexer 1202A is configured to route 32 bits in response to the address signals ADDR_A [4:0] and port configuration signals rdcfg_A[2:0]. Port configuration signals rdcfg_A[2:0] are used to select one of the six possible configurations. In the embodiment of FIG. 12 which shows a CAM implemented in a BRAM, the port configuration signals rdcfg_A[2:0] of Port A could be stored in configuration memory 1204A. Similarly, the port configuration signals rdcfg_B[2:0] of Port B could be stored in configuration memory 1204B. As will be described in more detail in reference to FIGS. 14-15, the rdcfg_A[2:0] and rdcfg_B[2:0] can be selected to output each 32 bits match of a CAM implemented in the BRAM.

Figure 13:
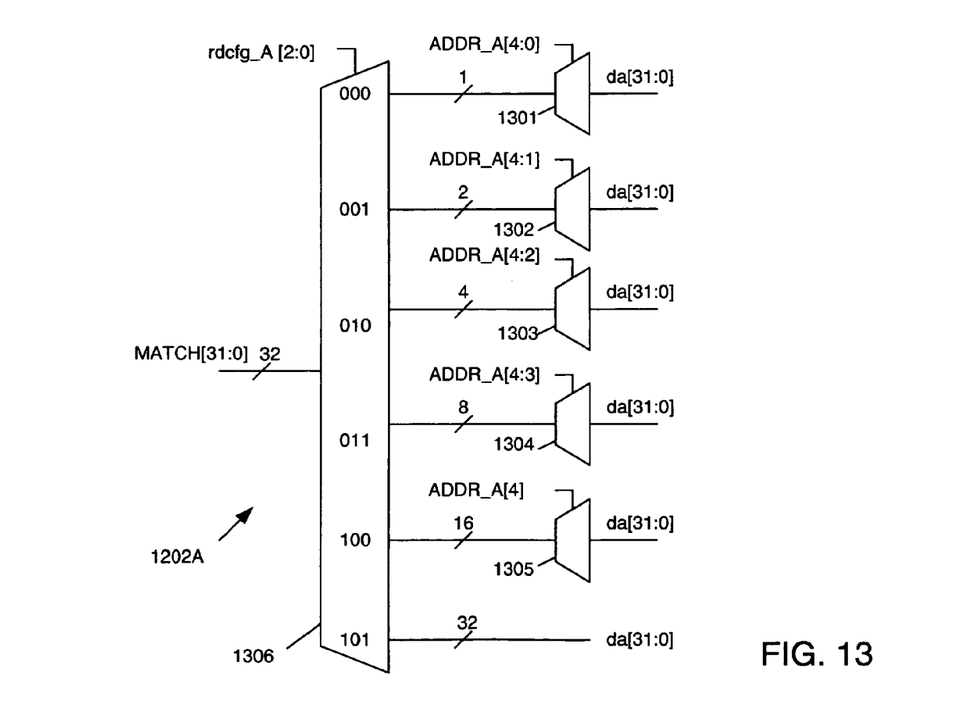
FIG. 13 is a block diagram showing an implementation of a multiplexer in a read path according to an embodiment of the present invention.

Turning now to FIG. 13, a block diagram shows an implementation of a multiplexer in a read path according to an embodiment of the present invention. In this embodiment, multiplexer 1202A includes multiplexers 1301-1306. The multiplexers are configured to pass a predetermined number of the 32 data signals da[31:0] in response to the address signals ADDR_A[4:0]. When implemented as a CAM outputting 32 bits from each port, all 32 data signals da[31:0] are provided to another input terminal of multiplexer 1306. That is, rdcfg_A[2:0] signals are selected to have a value of "101", thereby causing multiplexer 1306 to route all 32 data signals da[31:0]. The values routed by multiplexer 1202A are latched into data latch circuit 1203A and provided as the read output values MATCH[31:0].

Figure 14:
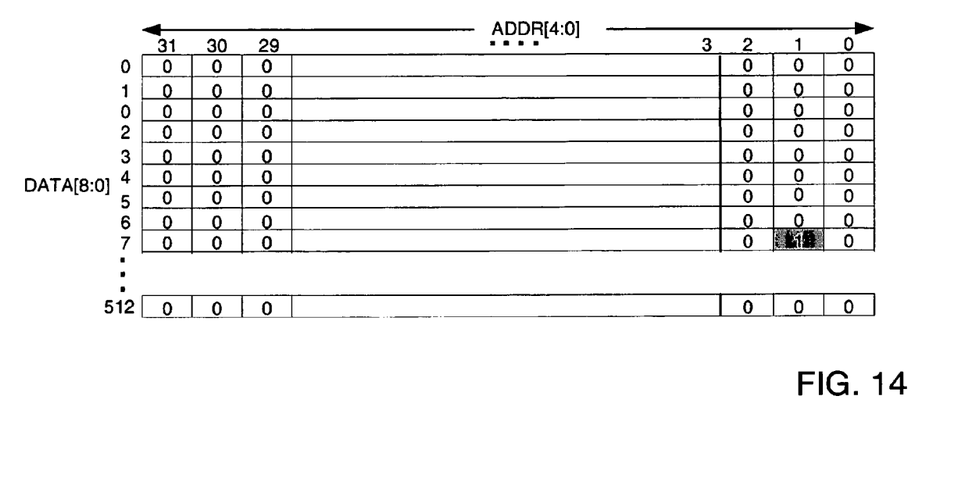
FIG. 14 is a table showing the port address mapping of a BRAM used as a CAM according to an embodiment of the present invention.

As described above, one benefit of the circuits and methods of the present invention is that a wider cam can be implemented, and that a sixty four bit word can be output by a single dual port RAM implemented as a CAM while allowing a single bit write on the write port. In order to illustrate one benefit of the circuits and methods of the present invention, reference is made to FIGS. 14 and 15. Turning first to FIG. 14, a table shows the port address mapping of a BRAM used as a CAM according to an embodiment of the present invention. A 9-bit data has $2^9$ (=512) possible values. A conventional RAM stores the 9-bit data into a 9-bit location. However the 9-bit data can also be represented as a 512-bit word, with all zeros and a single "one" at the nth location, where n corresponds to the position given by the decoded 9-bit data. For example, if the data is "000000111" (a decimal seven), the decoded 512-bit word is "0000 . . . 000010000000", where the "one" is at the seventh location counting from zero. Therefore, thirty-two 512-bit words store 32 decoded 9-bit words. In addition to implementing a CAM capable of reading full width (e.g. 64 bits in this example), the embodiments of the present invention enable writing to the CAM at a different width, for example 1 bit wide words. That is, by providing separate read decode logic and write decode logic for a given port, it is possible to write to and read from a port of the CAM using separate widths. As can been seen, the benefit of having different read and write widths is particularly significant in implementing a CAM. That is, because only a single bit is needed to indicate the location of a particular word in the memory, a write width of 1 bit is desirable. Similarly, because the decoded output word comprises multiple bits, a different read width is necessary.

Figure 15:
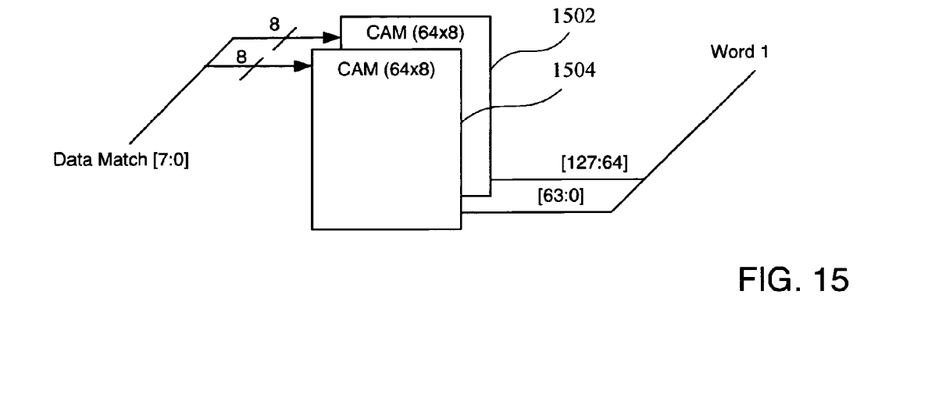
FIG. 15 is a block diagram showing a content addressable memory in match mode according to an embodiment of the present invention.

Turning now to FIG. 15, a block diagram shows a BRAM used as a CAM in match mode according to an embodiment of the present invention. FIG. 15 shows the match mode of a 128-word×8-bit CAM built on two dual port RAMS. The 128-bit decoded address bus is generated by merging four 32-bit decoded addresses from two 64×8 bit CAMS. That is, because the port width of each port of a single BRAM can be selected to output a 32 bit word, each dual port BRAM generates a 64 bit output word, and therefore only requiring two CAMs to generate an 128 bit word.

Figure 16:
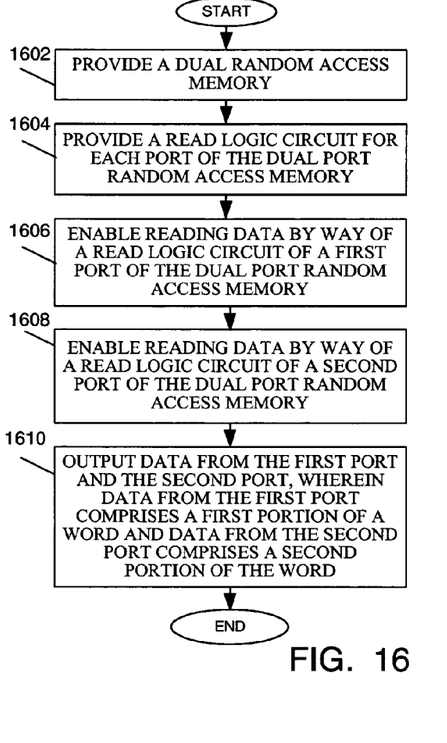
FIG. 16 is a flow chart showing a method of reading data from a dual port random access memory according to an embodiment of the present invention.

Turning now to FIG. 16, a flow chart shows a method of reading data from a dual port random access memory according to an embodiment of the present invention. In particular, a dual port random access memory is provided at a step 1602. A read logic circuit is provided for each port of the dual port random access memory at a step 1604. Reading data is enabled by way of a read logic circuit of a first port of the dual port random access memory at a step 1606. Reading data is also enabled by way of a read logic circuit of a second port of the dual port random access memory at a step 1608. Data is then output from the first port and the second port of the dual port random access memory at a step 1610, wherein data from the first port comprises a first portion of a word and data from the second port comprises a second portion of the word. The read logic circuit of FIG. 16 (or FIGS. 17-20 described below) could be the multiplexer read decode circuit of FIG. 9, for example, while the write logic circuit could be the multiplexer write decode logic circuit of FIG. 11, or some other suitable circuits.

Figure 17:
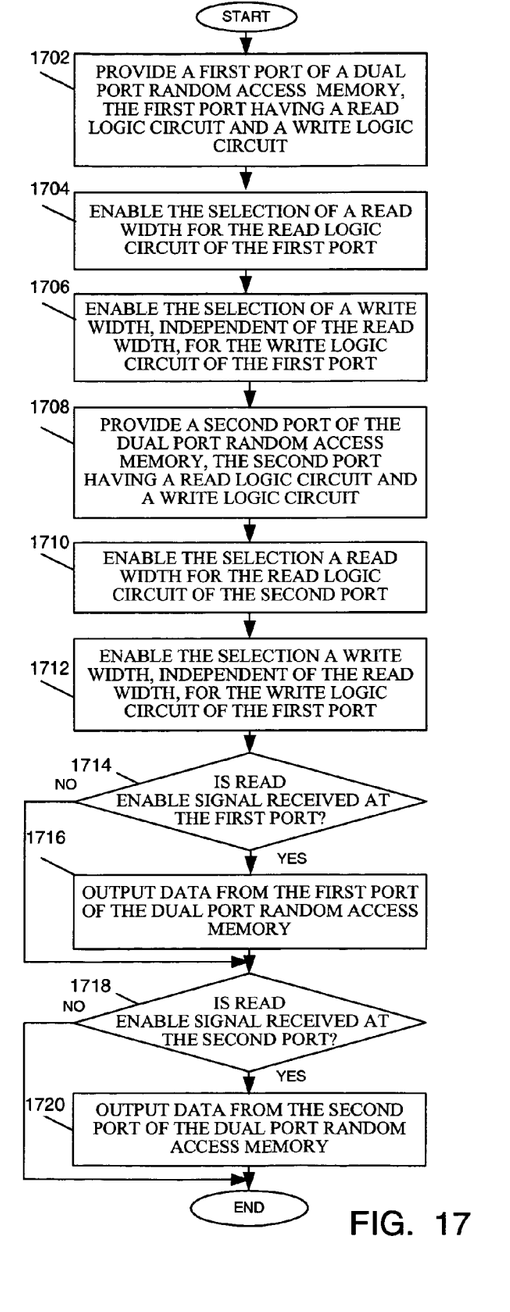
FIG. 17 is a flow chart showing a method of enabling the selection of a read width and a write width of a random access memory according to an embodiment of the present invention.

Turning now to FIG. 17, a flow chart shows a method of enabling the selection of a read width and a write width of a random access memory according to an embodiment of the present invention. In particular, a first port of a dual port random access memory is provided at step 1702. The first port has a read logic circuit and a write logic circuit. The selection a read width for the read logic circuit of the first port is enabled at a step 1704. Similarly, the selection a write width, independent of the read width, for the write logic circuit of the first port is enabled at a step 1706. A second port of the dual port random access memory is also provided at a step 1708. The second port also has a read logic circuit and a write logic circuit. The selection a read width for the read logic circuit of the second port is enabled at a step 1710. The selection of a write width, independent of the read width, for the write logic circuit of the second port is also enabled at a step 1712. It is then determined whether a read enable signal is received at the first port at a step 1714. If so, data is output from the first port of the dual port random access memory at a step 1716. It is then determined whether a read enable signal is received at the second port at a step 1718. If so, data is output from the second port of the dual port random access memory at a step 1720.

Figure 18:
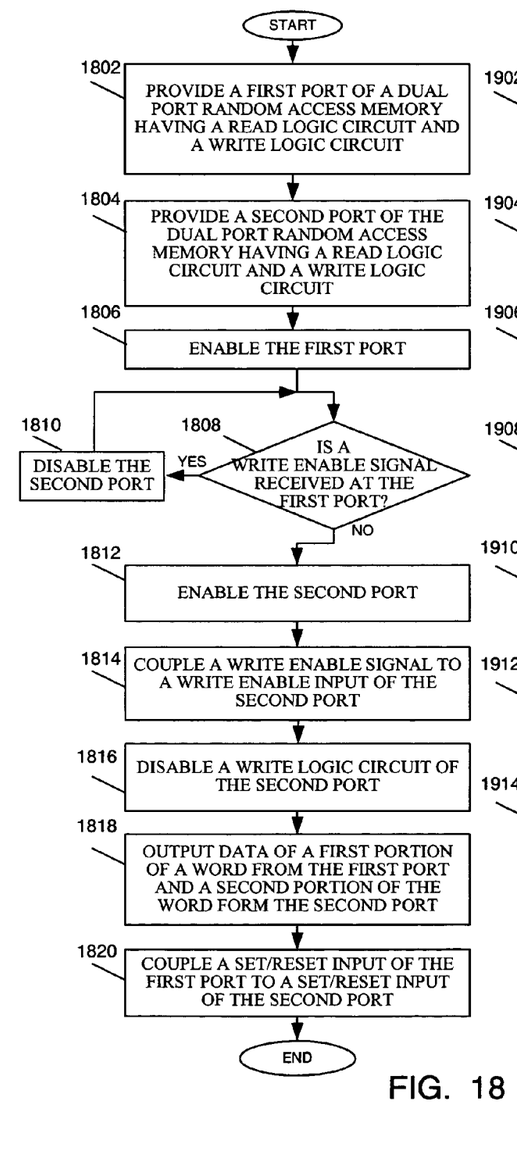
FIG. 18 is a flow chart showing a method of enabling reading a word from a first port and a second port of a dual port random access memory according to an embodiment the present invention.

Turning now to FIG. 18, a flow chart shows a method of enabling reading a word from a first port and a second port of a dual port random access memory according to an embodiment the present invention. In particular, a first port of a dual port random access memory having a read logic circuit and a write logic circuit is provided at a step 1802. A second port of the dual port random access memory is also provided at a step 1804. The second port also has a read logic circuit and a write logic circuit. The first port is then enabled at a step 1806. It is then determined whether a write enable signal is received at the first port at a step 1808. If so, the second port is disabled at a step 1810. If not, the second port is enabled at a step 1812. A write enable signal is then coupled to a write enable input of the second port at a step 1814. A write logic circuit of the second port is disabled at a step 1816. Data of a first portion of a word is output from the first port and data of a second portion of the word is output from the second port at a step 1818. Finally, a set/reset input of the first port is coupled to a set/reset input of the second port at a step 1820.

Figure 19:
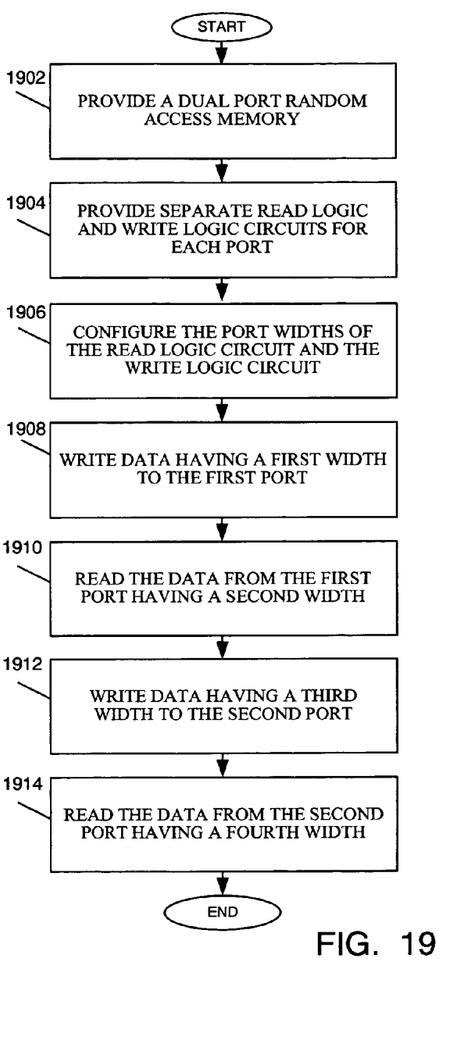
FIG. 19 is a flow chart showing a method of writing data having a first width to first and second ports of a random access memory, and outputting data having a second width from the first and second ports according to an embodiment of the present invention.

Turning now to FIG. 19, a flow chart shows a method of writing data having a first width to first and second ports and outputting data having a second width from the first and second ports according to an embodiment the present invention. A dual port random access memory is provided at a step 1902. Separate read logic and write logic circuits are provided for each port at a step 1904. The port widths of the read logic circuit and the write logic circuit are configured at a step 1906. Data having a first width is written to the first port at a step 1908. The data is then read from the first port having a second width at a step 1910. Data having a third width is written to the second port at a step 1912. The data is also read from the second port having a fourth width at a step 1914. Although the widths for reading and writing could be any value, the first and third widths for writing to the first and second ports, respectively, could be the same, while the third and fourth widths for reading from the first and second ports, respectively, could be the same.

Figure 20:
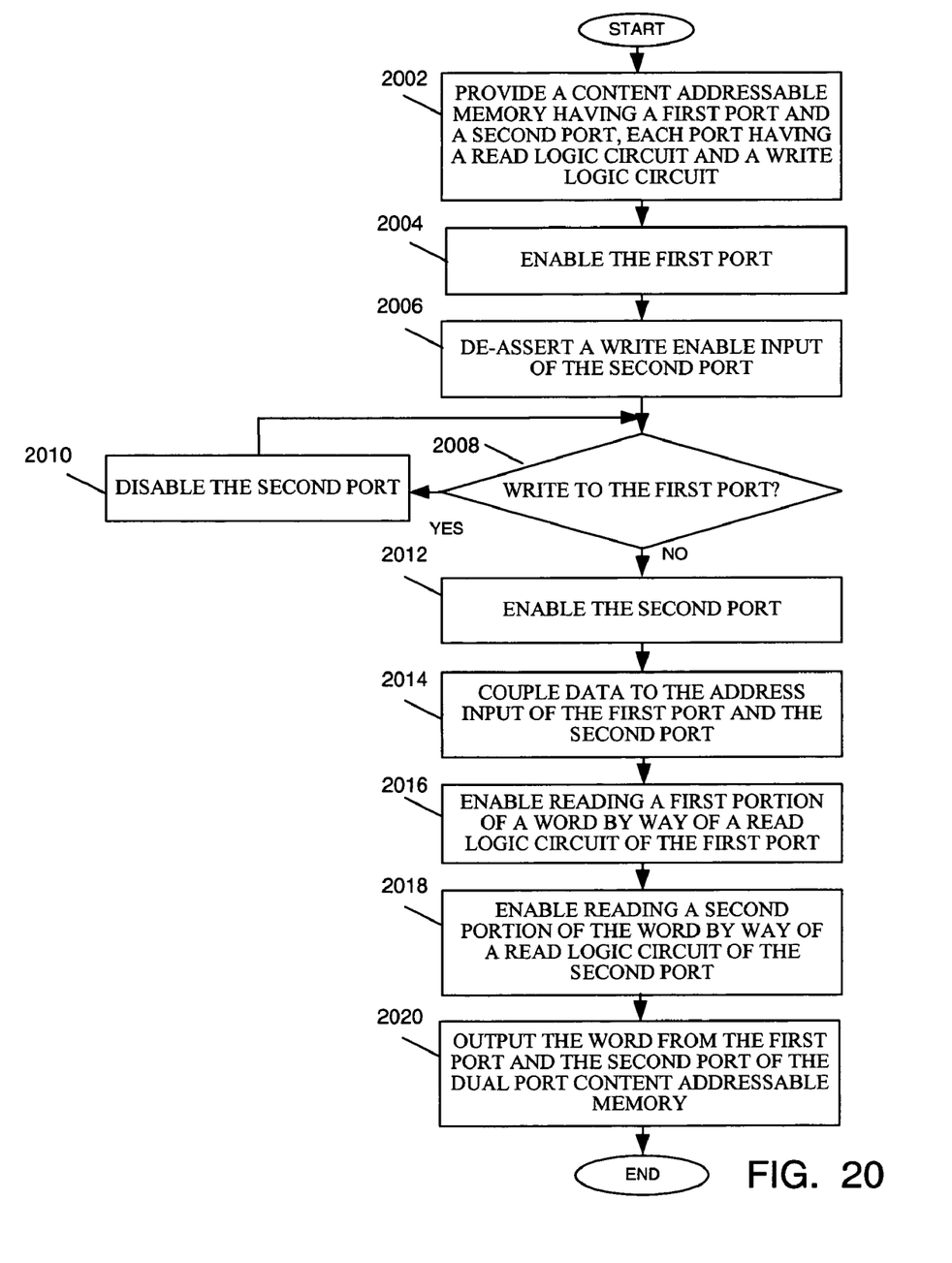
FIG. 20 is a flow chart showing a method of reading a word from a first port and a second port of a dual port random access memory used as a content addressable memory according to an embodiment the present invention.

Turning now to FIG. 20, a flow chart shows a method of reading a word from a first port and a second port of a dual port BRAM used as a CAM according to an embodiment of the present invention. In particular, content addressable memory having a first port and a second port is provided at a step 2002. Each port has a read logic circuit and a write logic circuit. The first port is then enabled at a step 2004. A write enable input of the second port is de-asserted at a step 2006. It is then determined whether a write to the first port is requested at a step 2008. If so, the second port is disabled at a step 2010. If not, the second port is enabled at a step 2012. Data is then coupled to the address input of the first port and the second port at a step 2014. Reading a first portion of a word is enabled by way of a read logic circuit of the first port at a step 2016. Reading a second portion of the word is also enabled by way of a read logic circuit of the second port at a step 2018. Finally, the word comprising data from the first port and the second port of the dual port content addressable memory is output at a step 2020.

It can therefore be appreciated that the new and novel memory device and method of transferring data in a memory device has been described. It will be appreciated by those skilled in the art that numerous alternatives and equivalents will be seen to exist which incorporate the disclosed invention. For example, although reference is made to BRAMs throughout this application, the circuits and methods described in this application could apply to any type of memory device. As a result, the invention is not to be limited by the foregoing embodiments, but only by the following claims.

The invention claimed is:

1. A circuit for accessing data in a memory, said circuit comprising:
 a first port having a read logic circuit;
 a first output coupled to said first port, said first output generating data comprising a first portion of a first word from said memory;
 a second port having a read logic circuit and a write logic circuit; and
 a second output coupled to said second port, said second output generating data comprising a second portion of said first word from said memory.

2. The circuit of claim 1 wherein said read logic circuit of said second port determines a read width, and said write logic circuit of said second port determines a write width which is independent of said read width.

3. The circuit of claim 1 wherein said first port further comprises a write logic circuit.

4. The circuit of claim 3 wherein said read logic circuit of said first port determines a read width, and said write logic circuit of said first port determines a write width which is independent of said read width.

5. A circuit for accessing data in a memory, said circuit comprising:
 a first port having a read logic circuit and a write logic circuit;
 a first output coupled to said first port, said first output generating data comprising a first portion of a first word from said memory;
 a second port having a read logic circuit and a write logic circuit; and
 a second output coupled to said second port, said second output generating data comprising a second portion of said first word from said memory.

6. The circuit of claim 5 wherein said read logic circuit of said first port determines a read width, and said write logic circuit of said first port determines a write width which is independent of said read width.

7. The circuit of claim 6 wherein said read logic circuit of said second port determines a read width, and said write logic circuit of said second port determines a write width which is independent of said read width.

8. The circuit of claim 5 wherein said first port and said second port comprise ports of a dual port random access memory.

9. A circuit for accessing data in a memory, said circuit comprising:
 first means for reading data from said memory, said first means for reading data having a first output associated with a first port and outputting data comprising a first portion of a word;
 first means for writing data to said memory, said first means for writing data having a first input associated with said first port; and
 second means for reading data from said memory, said second means for reading data having a second output port associated with said second port and outputting data comprising a second portion of said word.

10. The circuit of claim 9 further comprising first means for writing data to said memory, said first means for writing data being associated with said first port.

11. The circuit of claim 10 wherein said first means for reading data from said memory enables selecting a read width, and said first means for writing data enables selecting a write width which is independent of said read width.

12. The circuit of claim 9 wherein first means for reading data outputs data comprising a first portion of a first word.

13. The circuit of claim 12 wherein second means for reading data outputs data comprising a second portion of said first word.

14. A method of accessing data in a memory, said method comprising the steps of:
 providing a first port of a dual port random access memory, said first port having a read logic circuit and a write logic circuit;

enabling the selection of a read width for said read logic circuit of said first port;

enabling the selection a write width for said write logic circuit of said first port;

outputting data from said first port of said dual port random access memory, wherein the step of outputting data comprises a step of outputting data of a first portion of a word from said first port and a second portion of the word from a second port.

15. The method of claim 14 further comprising a step of providing a second port of said dual port random access memory, said second port having a read logic circuit and a write logic circuit.

16. The method of claim 15 further comprising a step of enabling the selection of a read width for said read logic circuit of said second port.

17. The method of claim 16 further comprising a step of outputting data from said second port of said dual port random access memory.

18. A method of accessing data in a memory, said method comprising the steps of:

providing a dual port random access memory, each port having a read logic circuit and a write logic circuit;

enabling reading data by way of a read logic circuit of a first port of said dual port random access memory;

enabling reading data by way of a read logic circuit of a second port of said dual port random access memory;

outputting data from said first port and said second port of said dual port random access memory, wherein the step of outputting data comprises a step of outputting a first portion of a word from said first port and outputting a second portion of said word from said second port.

19. The method of claim 18 further comprising a step of providing a write logic circuit associated with said first port to enable writing data to said dual port random access memory.

20. The method of claim 19 further comprising a step of providing a write logic circuit associated with said second port to enable writing data to said dual port random access memory.

21. The method of claim 20 further comprising a step of enabling said second port when a write enable signal to said first port is disabled.

* * * * *